(12) United States Patent
Lin et al.

(10) Patent No.: US 7,808,567 B2
(45) Date of Patent: Oct. 5, 2010

(54) PIXEL STRUCTURES, METHODS OF FORMING THE SAME AND MULTI DOMAIN VERTICAL ALIGNMENT LCDS

(75) Inventors: Hsiang-Lin Lin, Hsinchu (TW);
Seok-Lyul Lee, Hsinchu (TW);
Tun-Chun Yang, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 434 days.

(21) Appl. No.: 11/941,534

(22) Filed: Nov. 16, 2007

(65) Prior Publication Data
US 2009/0033815 A1 Feb. 5, 2009

(30) Foreign Application Priority Data
Jul. 31, 2007 (TW) .............................. 96127961 A

(51) Int. Cl.
G02F 1/1368 (2006.01)
G02F 1/1343 (2006.01)
G02F 1/139 (2006.01)

(52) U.S. Cl. ........................... 349/42; 349/38; 349/129; 349/139; 349/187

(58) Field of Classification Search ................... 349/38, 349/39, 42, 43, 128, 129, 130, 139, 143, 349/187; 257/59, 72; 438/30, 155, 158; 345/92
See application file for complete search history.

(56) References Cited
U.S. PATENT DOCUMENTS
5,920,082 A 7/1999 Kitazawa et al.
6,627,470 B2 9/2003 Yoo et al.
2005/0185120 A1 8/2005 Kitoh et al.
2005/0200791 A1* 9/2005 Ahn ........................... 349/141

FOREIGN PATENT DOCUMENTS
CN 1658031 8/2005

* cited by examiner

*Primary Examiner*—Dung T Nguyen
*Assistant Examiner*—Tai Duong
(74) *Attorney, Agent, or Firm*—Thomas, Kayden, Horstemeyer & Risley, LLP

(57) ABSTRACT

A pixel structure is provided. The pixel structure comprises a lower substrate with a transistor and pixel area; a first patterned conductive layer, which has a data line and a gate within the transistor area that is disposed on the lower substrate; a patterned insulator layer covering the first patterned conductive layer; an active layer disposed on the patterned insulator layer above the gate; a second patterned conductive layer with a gate line disposed on the patterned insulator layer, source and drain, wherein the source and the drain are disposed on the active layer; a pixel electrode disposed on the patterned insulator layer and electrically connected to the drain; a patterned passivation layer disposed on the patterned insulator layer, gate line, source, drain and pixel electrode; and a third patterned conductive layer, which has a data line connecting electrode, a gate line connecting electrode, at least one alignment electrode and a common electrode. The data line is electrically connected to the source through the data line connecting electrode; the gate line is electrically connected to the gate through the gate line connecting electrode; the alignment electrode is electrically connected to the pixel electrode; and a portion of the common electrode is disposed above the data line.

23 Claims, 5 Drawing Sheets

PIXEL STRUCTURES, METHODS OF FORMING THE SAME AND MULTI DOMAIN VERTICAL ALIGNMENT LCDS

CROSS-REFERENCES TO RELATED APPLICATIONS

This application is related to co-pending U.S. patent application Ser. No. 12/040,281, filed on Feb. 29, 2008, and entitled "Pixel Structure and Method for Manufacturing the Same."

This application claims the benefit from the priority of Taiwan Patent Application No. 096127961, filed on Jul. 31, 2007, the contents of which are herein incorporated by reference in its entirety.

BACKGROUND OF THE INVENTION

1. Field of the Invention

The present invention relates to a pixel structure, a multi-domain vertical alignment mode liquid crystal display (LCD) using the pixel structure, and also a method for forming the pixel structure.

2. Descriptions of the Related Art

Conventional LCDs (e.g., LCDs of the TN type) have different phase difference values and exhibit different luminances at different viewing angles. Furthermore, gray scale inversions may be found in such LCDs. These problems inevitably lead to a limited viewing angle range in conventional LCDs, especially in commonly used large size display panels.

As a result, many technologies have aimed to enlarge the viewing angle range, one of which is the multi-domain vertical alignment (MVA) technology. The main concept of MVA technology is to divide the LCD into a plurality of alignment areas so that the respective liquid crystal materials compensate for each other. The resulting LCD then exhibits the same phase difference value at different viewing angles to enlarge the viewing angle range and prevent gray scale inversions. For this reason, in common MVA technology, protrusions are arranged at appropriate locations (for example, on a color filter) in the LCD, to form a plurality of alignment areas. In short, such a technology relies on the protrusions to tilt the liquid crystal materials, so that when a voltage is applied, the liquid crystal materials in the different alignment areas will be driven to tilt in different directions, resulting in an improved viewing angle range. Although this may get rid of the narrow viewing angle range, light leakage due to the protrusions is often found in LCDs employing this method. As a result, the display effect will be adversely affected.

It can be seen from the above description that enlarging the viewing angle range by arranging protrusions in the LCD panel tends to cause light leakage. In view of this, it is important to design an LCD that will have a large viewing angle range without adding protrusions.

SUMMARY OF THE INVENTION

One objective of this invention is to provide a pixel structure comprising a lower substrate with a transistor and pixel area; a first patterned conductive layer deposited on the lower substrate, which includes a data line and a gate disposed in the transistor area; a patterned insulating layer covering the first patterned conductive layer; an active layer deposited on the patterned insulating layer above the gate; a second patterned conductive layer deposited on the patterned insulating layer and the active layer, which includes a gate line, a source and a drain, wherein the source and the drain are both disposed on the active layer; a pixel electrode deposited on the patterned insulating layer and electrically connected to the drain; a patterned passivation layer covering the pattern insulating layer, the second patterned conductive layer and the pixel electrode; a third patterned conductive layer deposited on the patterned passivation layer; a data-line-connected electrode electrically connecting the data line with the source; a gate-line-connected electrode electrically connecting the gate line with the gate; at least one alignment electrode electrically connected to the pixel electrode; and a common electrode, wherein a portion of the common electrode is deposited above the data line.

Another objective of this invention is to provide a multi-domain vertical alignment mode liquid crystal display (LCD) device comprising: an upper substrate, a lower substrate with a transistor and pixel area defined therein, and a liquid crystal material interposed between the upper substrate and the lower substrate, wherein the pixel area has a plurality of alignment areas defined therein. The multi-domain vertical alignment mode LCD further comprises a pixel electrode deposited in the pixel area between the upper substrate and the lower substrate, and at least one alignment electrode deposited on the pixel electrode and electrically connected to the pixel electrode.

Yet a further objective of this invention is to provide a method for forming a pixel structure, which is utilized for a multi-domain vertical alignment mode liquid crystal display device. The method comprises the following steps: providing a lower substrate with a transistor and pixel area; forming a first patterned conductive layer, which includes a data line and a gate disposed in the transistor area, on the lower substrate; forming an insulating layer covering the first patterned conductive layer; forming an active layer on the patterned insulating layer above the gate; forming a second patterned conductive layer which includes a gate line, a source and a drain, wherein the source and the drain are both disposed in the transistor area; forming a pixel electrode in the pixel area which electrically connects to the drain; forming a passivation layer covering the insulating layer, the second patterned conductive layer and the pixel electrode; performing an etching process to form a plurality of contact windows in the passivation layer and the insulating layer to expose a portion of the source, a portion of the data line, a portion of the pixel electrode, a portion of the gate and a portion of the gate line; and forming a third patterned conductive layer on the passivation layer and within the plurality of contact windows.

In forming the pixel structure of this invention, the third patterned conductive layer is formed using the following steps: forming a data-line-connected electrode on both the exposed portion of the source and the exposed portion of the data line to electrically connect the data line with the source; forming a gate-line-connected electrode on the exposed portion of the gate and the exposed portion of the gate line to electrically connect the gate line with the gate; and forming at least one alignment electrode on the exposed portion of the pixel electrode for electrical connection with the pixel electrode.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
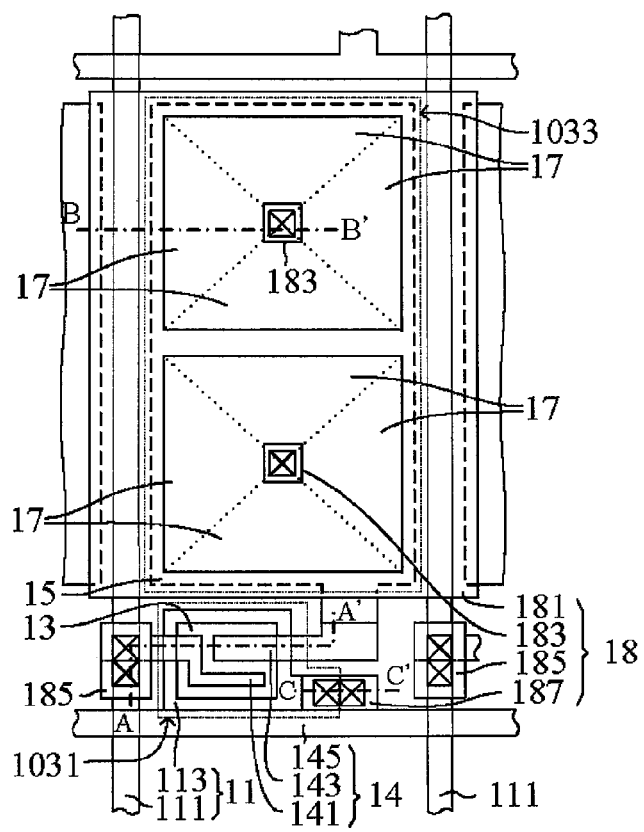
FIG. 1A is the top view of a pixel structure of this invention.
Figure 1B:
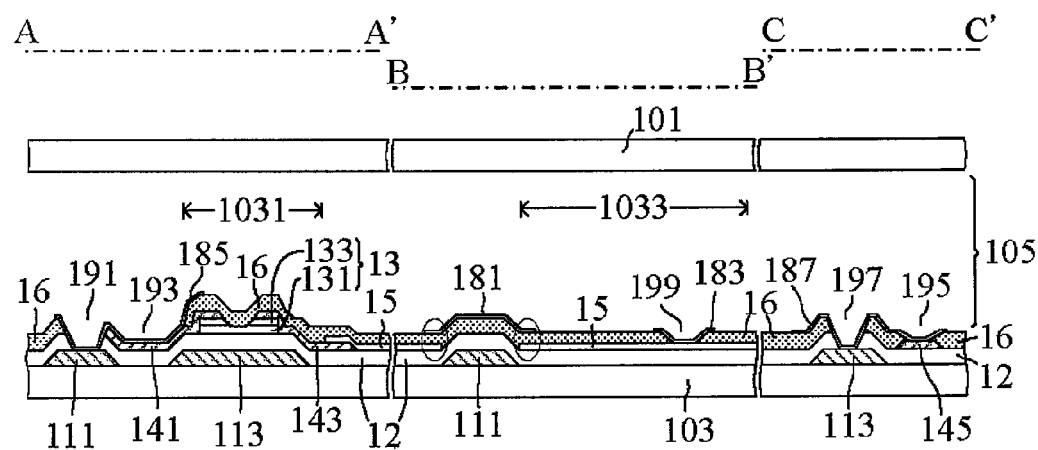
FIG. 1B depicts cross-sectional views taken along lines AA', BB' and CC' in FIG. 1A.

To effectively eliminate the shortcoming of narrow viewing angles and light leakages as described above, a multi-domain vertical alignment mode LCD using the pixel structure are proposed in the present invention. FIGS. 1A and 1B illustrate schematic views of a multi-domain vertical alignment mode LCD using the pixel structure of this invention. More particularly, FIG. 1A depicts the top view of a pixel structure disposed on the lower substrate, while FIG. 1B depicts cross-sectional views taken along lines AA', BB' and CC' in FIG. 1A respectively. The multi-domain vertical alignment mode LCD comprises an upper substrate 101, a lower substrate 103 with a transistor area 1031 and a pixel area 1033 defined therein, and a liquid crystal layer 105 interposed between the upper substrate 101 and the lower substrate 103, wherein the pixel area 1033 has a plurality of alignment areas 17 defined therein.

Between the upper substrate 101 and the lower substrate 103 of the multi-domain vertical alignment mode LCD, i.e., on the top surface of the lower substrate 103 facing the upper substrate 101, a first patterned conductive layer 11 is deposited, which comprises a data line 111 and a gate 113 disposed in the transistor area 1031. A patterned insulating layer 12 overlays the first patterned conductive layer 11. On the patterned insulating layer 12 above the gate 113, an active layer 13 is disposed. The active layer 13 comprises a semiconductor channel layer 131 and an Ohmic contact layer 133 on the semiconductor channel layer 131.

A second patterned conductive layer 14 is deposited on the patterned insulating layer 12 and on the active layer 13. The second patterned conductive layer 14 comprises a gate line 145, a source 141 and a drain 143, wherein the source 141 and the drain 143 are both disposed on the active layer 13. A pixel electrode 15 is deposited on the patterned insulating layer 12 and electrically connected to the drain 143.

FIG. 1B illustrates the multi-domain vertical alignment mode LCD of the present invention, in which the pixel electrode 15 and the data line 111 are disposed in different layers. More specifically, the data line 111 is disposed on the lower substrate 103, while the pixel electrode 15 is disposed on the patterned insulating layer 12. This structure design allows the data line 111 and the pixel electrode 15 to be disposed in different layers, and thus, spaced from each other in the vertical direction with an insulation material (i.e., the patterned insulating layer 12) interposed therebetween. The distance between the data line 111 and the pixel electrode 15 may be further reduced without incurring a short circuit. As a result, the aperture ratio of the pixel structure is further increased. In other words, more light may reach the LCD and exit the LCD more efficiently. The light loss in the LCD is then reduced.

The patterned passivation layer 16 overlays the patterned insulating layer 12, the second patterned conductive layer 14 and the pixel electrode 15. In both the patterned insulating layer 12 and the patterned passivation layer 16 above the data line 111, a first contact window 191 is formed to expose a portion of the data line 111. In the patterned passivation layer 16 above the source 141, a second contact window 193 is formed to expose a portion of the source 141. Moreover, in the patterned passivation layer 16 above the gate line 145, a third contact window 195 is formed to expose a portion of the gate line 145. In the patterned insulating layer 12 and the patterned passivation layer 16 above the gate 113, a fourth contact window 197 is formed to expose a portion of the gate 113. Furthermore, in the patterned passivation layer 16 above the pixel electrode 15, at least a fifth contact window 199 is formed to expose a portion of the pixel electrode 15.

Figure 2A:
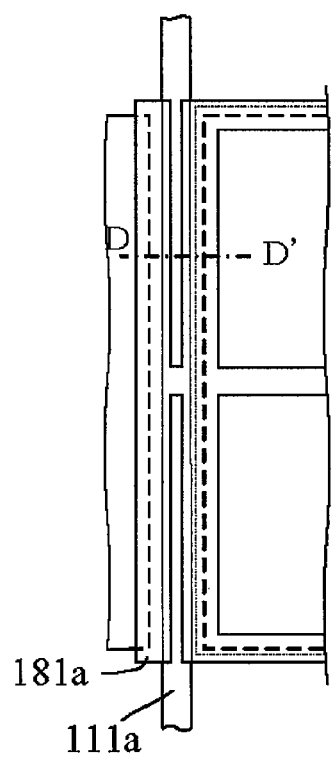
FIGS. 2A and 2B are schematic views illustrating discontinuities present in the common electrode above the data line in a direction traverse to the data line.
Figure 2B:
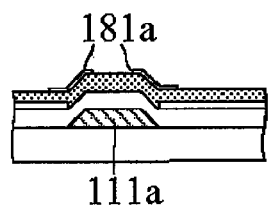

A third patterned conductive layer 18 that is deposited on the patterned passivation layer 16 comprises a common electrode 181, an alignment electrode 183, a data-line-connected electrode 185 and a gate-line-connected electrode 187. A portion of the common electrode 181 is located above the data line 111, while another portion of the common electrode 181 is located above the pixel electrode 15 to form a storage capacitor (the circled part shown in the figure). In this embodiment, the portion of the common electrode 181 above the data line 111 has no discontinuity in the direction transverse to the data line 111. However, there can also be discontinuities in the transverse direction, as shown in FIGS. 2A and 2B, where the two portions of the common electrode 181 are bridged via a strip area, thus forming an H-shaped partial common electrode 181*a*. The partial common electrode 181*a* is continuous only transversely in the bridge area, with other portions being discontinuous.

The data-line-connected electrode 185 is deposited within the first contact window 191 and the second contact window 193 to electrically connect the data line 111 to the source 141. The gate-line-connected electrode 187 is deposited within the third contact window 195 and the fourth contact window 197 to electrically connect the gate line 145 to the gate 113. The alignment electrode 183 is deposited within the fifth contact window 199 and electrically connected to the pixel electrode 15. Because the alignment electrode 183 is electrically connected with the pixel electrode 15, when a voltage is applied to the pixel electrode 15, the alignment electrode 183 will be energized to the same potential as the pixel electrode 15, thus generating an electric field that aligns the liquid crystal materials. This electric field will drive the liquid crystal materials in various alignment areas around the alignment electrode 183 to tilt in different directions and thus, enlarge the viewing angle range. As a result, the present invention can enlarge the viewing angle range and eliminate light leakage by using alignment electrodes disposed in the pixel areas to provide an alignment electric field, without using the protrusions provided in the prior art.

Figure 3:
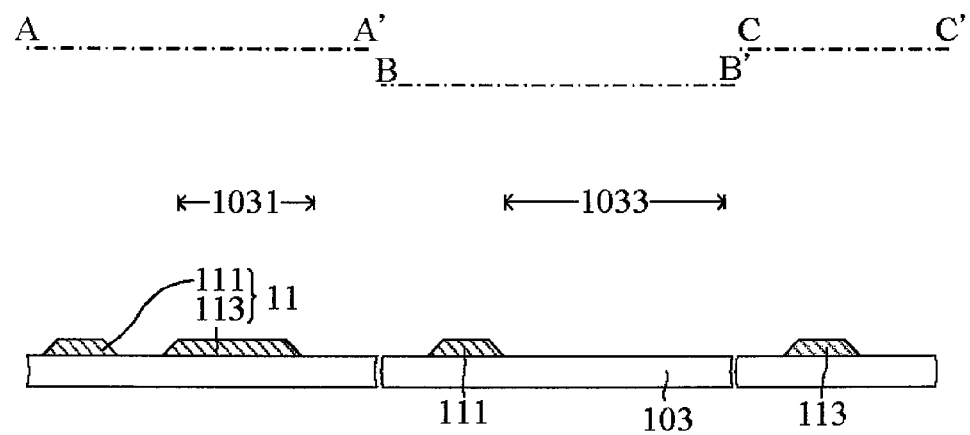
FIGS. 3 to 8 are schematic views of a process flow for forming the pixel structure of this invention.

Referring also to FIG. 1A, a method of forming such a pixel structure of this invention will be described hereinafter. First, in reference to FIG. 3, a lower substrate 103 with a transistor area 1031 and a pixel area 1033 defined therein is provided. Then, on the lower substrate 103, a first patterned conductive layer 11 is formed, which includes a data line 111 and a gate 113 disposed in the transistor area 1031.

Figure 4:
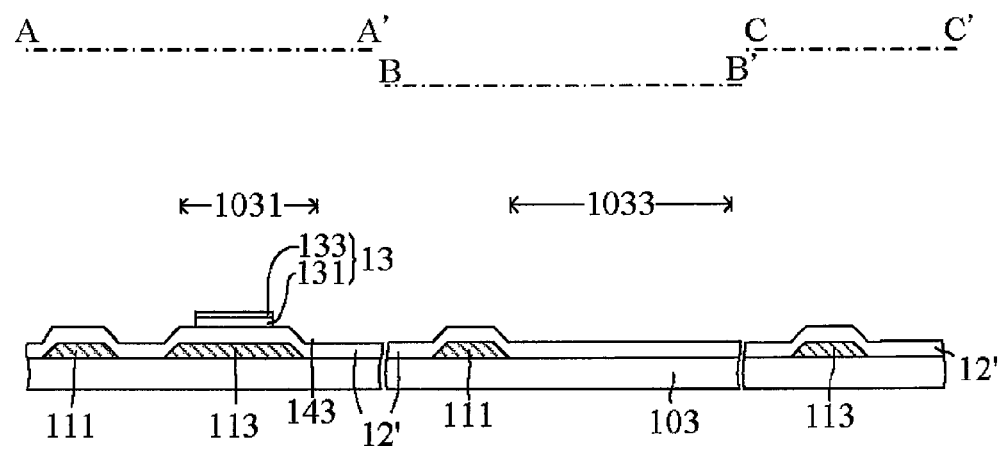

Next, in reference to FIG. 4, an insulating layer 12' is overlaid on the first patterned conductive layer 11, followed by the formation of an active layer 13 on the insulating layer 12' above the gate. Here, the formation of the active layer 13 may be done sequentially using a semiconductor channel layer 131 and an Ohmic contact layer 133 on the insulating layer 12'.

Figure 5:
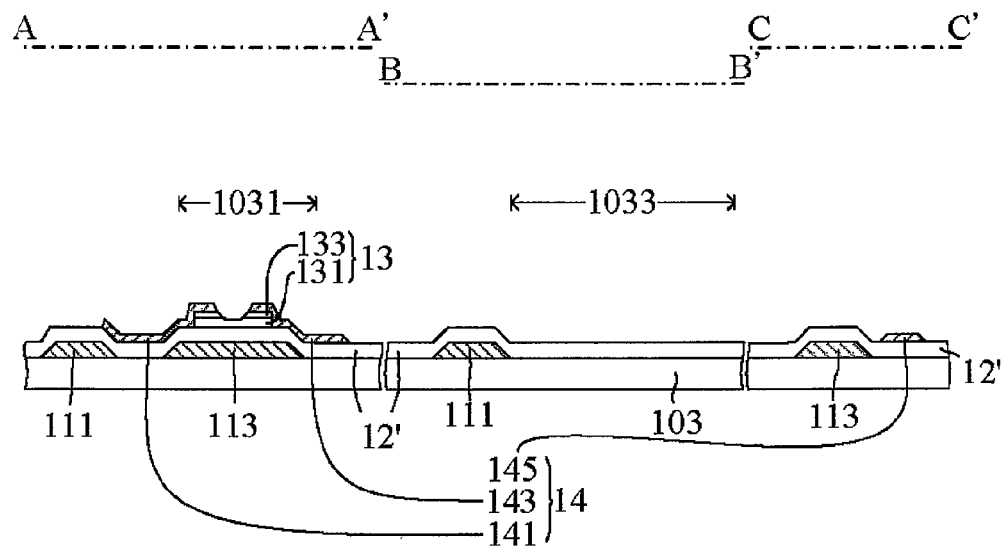

Next, in reference to FIG. 5, a second patterned conductive layer 14 is formed, which includes a source 141, a drain 143, and a gate line 145. The source 141 and the drain 143 are both disposed in the transistor area 1031 and electrically connected to the Ohmic contact layer 133 respectively. In more detail, a conductive layer is first formed on the insulating layer 12', and is then patterned with a lithographic and etching technology to form a second patterned conductive layer 14. During this etching process, the Ohmic contact layer 133 between the source 141 and the drain 143 is etched concurrently, leading to a division of the Ohmic contact layer 133 into a source portion and a drain portion (not shown).

Figure 6:
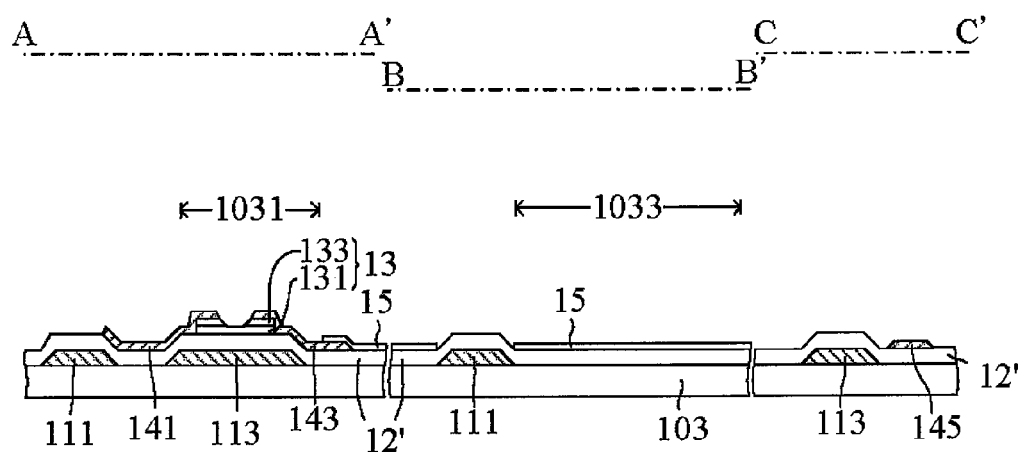

Subsequently, in reference to FIG. 6, a pixel electrode 15 is formed in the pixel area 1033 and electrically connected to the drain 143. The pixel electrode 15 is made of a transparent conductive material, including indium tin oxide, indium zinc oxide and combinations thereof.

Figure 7:
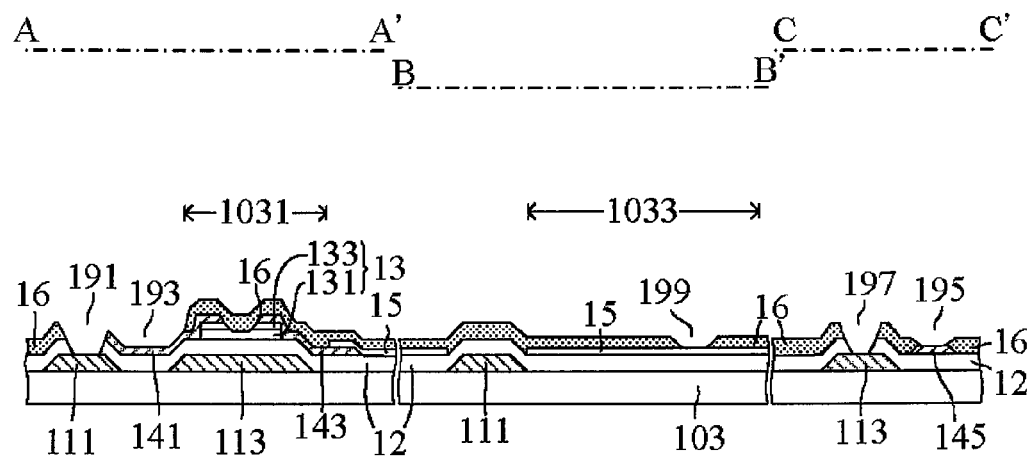

Next, in reference to FIG. 7, a passivation layer (not shown) is formed to cover the insulating layer 12', the second patterned conductive layer 14 and the pixel electrode 15. Thereafter, an etching process is performed to form a patterned insulating layer 12 and a patterned passivation layer 16. The patterned insulating layer 12 and the patterned passivation layer 16 comprise a first contact window 191, a second contact window 193, a third contact window 195, a fourth contact window 197, and at least one fifth contact window 199, to expose a portion of the data line 111, a portion of the source 141, a portion of the gate line 145, a portion of the gate 113 and a portion of the pixel electrode 15. The etching process can be any appropriate wet or dry etching process.

Figure 8:
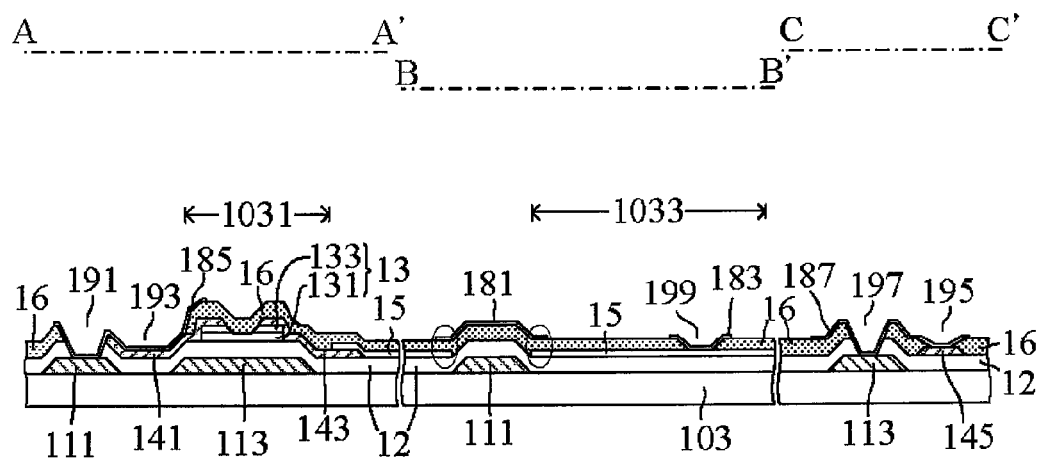

Finally, as shown in FIG. 8, a third patterned conductive layer 18 is formed to cover the patterned passivation layer 16 and the respective contact windows 191, 193, 195, 197, 199. In more detail, the third patterned conductive layer 18 comprises a common electrode 181, at least one alignment electrode 183, a data-line-connected electrode 185 and a gate-line-connected electrode 187. The data-line-connected electrode 185 is formed within the first contact window 191 and the second contact window 193 to electrically connect the data line 111 to the source 141. The gate-line-connected electrode 187 is formed within the third contact window 195 and the fourth contact window 197 to electrically connect the gate 113 to the gate line 145. The alignment electrode 183 is formed within the fifth contact window 199 and electrically connected to the pixel electrode 15.

The third patterned conductive layer 18 is made of a material selected from the group consisting of transparent conductive materials, conductive metals, conductive metal alloys, and combinations thereof. The transparent conductive materials may be indium tin oxide, indium zinc oxide or combinations thereof, while the conductive metals may be Al, Cu, W, Cr, Mo, or combinations thereof.

In conclusion, by disposing an alignment electrode at the same potential as the pixel electrode, the present invention may use the pixel structure of multi-domain vertical alignment mode LCDs to enlarge the viewing angle range. Moreover, by disposing the data line on the lower substrate and disposing the pixel electrode on the patterned insulating layer, the present invention may further increase the aperture ratio of the pixel structure.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A pixel structure comprising:
    a lower substrate having a transistor area and a pixel area;
    a first patterned conductive layer deposited on the lower substrate, and comprising a data line and a gate in the transistor area;
    a patterned insulating layer covering the first patterned conductive layer;
    an active layer deposited on the patterned insulating layer and above the gate;
    a second patterned conductive layer deposited on the patterned insulating layer and the active layer which include a gate line, a source and a drain, wherein the source and the drain both are disposed on the active layer;
    a pixel electrode deposited on the patterned insulating layer and electrically connected to the drain;
    a patterned passivation layer covering the pattern insulating layer, the second patterned conductive layer and the pixel electrode; and
    a third patterned conductive layer deposited on the patterned passivation layer, and comprising a data-line-connected electrode electrically connecting the data line with the source, a gate-line-connected electrode electrically connecting the gate line with the gate, at least one alignment electrode electrically connected to the pixel electrode, and a common electrode, wherein a portion of the common electrode is deposited above the data line.

2. The pixel structure as claimed in claim 1, wherein the common electrode partially overlaps the pixel electrode to form a storage capacitor.

3. The pixel structure as claimed in claim 1, wherein the active layer includes a semiconductor channel layer and an Ohmic contact layer thereon.

4. The pixel structure as claimed in claim 1, wherein a first contact window is present in the patterned insulating layer and the patterned passivation layer and above the data line, and a second contact window is present in the patterned passivation layer and above the source, wherein the data-line-connected electrode is disposed within the first contact window and the second contact window and electrically connects the data line with the source.

5. The pixel structure as claimed in claim 1, wherein a third contact window is present in the patterned passivation layer and above the gate line, a fourth contact window is present in the patterned insulating layer and the patterned passivation layer and above the gate, the gate-line-connected electrode is disposed within the third contact window and the fourth contact window and electrically connects the gate line and the gate.

6. The pixel structure as claimed in claim 1 wherein at least one fifth contact window is present in the patterned passivation layer above the pixel electrode and the at least one alignment electrode is disposed within each of the at least one fifth contact window and electrically connects with the pixel electrode.

7. A multi-domain vertical alignment mode liquid crystal display device comprising an upper substrate, a lower substrate having a transistor area and a pixel area that includes a plurality of alignment areas defined therein, and a liquid crystal material placed between the upper substrate and the lower substrate; and, between the upper substrate and the lower substrate, further comprising:

a pixel electrode deposited in the pixel area;

at least one alignment electrode deposited on the pixel electrode and electrically connected to the pixel electrode;

a first patterned conductive layer deposited on the lower substrate, and including a data line and a gate in the transistor area;

a patterned insulating layer covering the first patterned conductive layer;

an active layer deposited on the patterned insulating layer and above the gate;

a source and a drain relative to the active layer and disposed on the two sides of the active layer respectively, wherein the pixel electrode is disposed on the patterned insulating layer and electrically connected to the drain;

a gate line deposited on the patterned insulating layer and electrically connected to the gate;

a patterned passivation layer covering the source, the drain, the gate line and the pixel electrode; and a common electrode deposited on the patterned passivation layer, wherein a portion of the common electrode is above the data line, and the at least one alignment electrode is partially deposited on the patterned passivassion layer.

8. The multi-domain vertical alignment mode liquid crystal display device as claimed in claim 7, wherein the common electrode further overlaps the pixel electrode to form a storage capacitor.

9. The multi-domain vertical alignment mode liquid crystal display device as claimed in claim 7 further comprising a data-line-connected electrode for electrically connecting the data line with the source, wherein the data-line-connected electrode is partially deposited on the patterned passivation layer.

10. The multi-domain vertical alignment mode liquid crystal display device as claimed in claim 7 further comprising a gate-line-connected electrode for electrically connecting the gate line with the gate, wherein the gate-line-connected electrode is partially deposited on the patterned passivation layer.

11. The multi-domain vertical alignment mode liquid crystal display device as claimed in claim 7, wherein the active layer includes a semiconductor channel layer and an Ohmic contact layer thereon.

12. The multi-domain vertical alignment mode liquid crystal display device as claimed in claim 11, wherein the source and the drain are both electrically connected to the Ohmic contact layer respectively.

13. A method of forming a pixel structure, which is utilized for a multi-domain vertical alignment mode liquid crystal display device, comprising:

providing a lower substrate having a transistor area and a pixel area;

forming a first patterned conductive layer on the lower substrate which includes a data line and a gate in the transistor area;

forming an insulating layer covering the first patterned conductive layer;

forming an active layer on the insulating layer and above the gate;

forming a second patterned conductive layer which includes a gate line, a source and a drain in the transistor area;

forming a pixel electrode in the pixel area which electrically connects to the drain;

forming a passivation layer covering the insulating layer, the second patterned conductive layer and the pixel electrode;

performing an etching process to form a plurality of contact windows in the passivation layer and the insulating layer to expose a portion of the source, a portion of the data line, a portion of the pixel electrode, a portion of the gate and a portion of the gate line, thereby forming a patterned insulating layer and a patterned passivation layer; and forming a third patterned conductive layer on the patterned passivation layer and within the plurality of contact windows.

14. The method as claimed in claim 13, wherein the step of forming the third patterned conductive layer comprises forming a data-line-connected electrode on the exposed portion of the source and the exposed portion of the data line to electrically connect the data line with the source.

15. The method as claimed in claim 13, wherein the step of forming the third patterned conductive layer comprises forming a gate-line-connected electrode on the exposed portion of the gate and the exposed portion of the gate line to electrically connect the gate line with the gate.

16. The method as claimed in claim 13, wherein the step of forming the third patterned conductive layer comprises forming at least one alignment electrode on the exposed portion of the pixel electrode for electrically connecting to the pixel electrode.

17. The method as claimed in claim 13, wherein the step of forming the third patterned conductive layer comprises forming a common electrode, wherein a portion of the common electrode is above the data line.

18. The method as claimed in claim 17, wherein the common electrode further overlaps the pixel electrode to form a storage capacitor.

19. The method as claimed in claim 13, wherein the etching process comprises a wet etching process or a dry etching process.

20. The method as claimed in claim 13, wherein the step of forming the active layer includes forming a semiconductor channel layer and an Ohmic contact layer thereon.

21. The method as claimed in claim 20, wherein the source and the drain are electrically connected to the Ohmic contact layer respectively.

22. The method as claimed in claim 13, wherein the third patterned conductive layer is made of a material selected from the group consisting of indium tin oxide, indium zinc oxide, Al, Cu, W, Cr, Mo, and combinations of the foregoing.

23. The method as claimed in claim 13, wherein the pixel electrode comprises indium tin oxide, indium zinc oxide or a combination of the foregoing.

* * * * *